United States Patent
Fueldner et al.

(10) Patent No.: US 10,793,419 B2
(45) Date of Patent: Oct. 6, 2020

(54) MEMS ASSEMBLY

(71) Applicant: Infineon Technologies AG, Neubiberg (DE)

(72) Inventors: Marc Fueldner, Neubiberg (DE); Niccolo De Milleri, Villach (AT); Bernd Goller, Otterfing (DE); Ulrich Krumbein, Rosenheim (DE); Gerhard Lohninger, Munich (DE); Giordano Tosolini, Munich (DE); Andreas Wiesbauer, Poertschach (AT)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 16/270,315

(22) Filed: Feb. 7, 2019

(65) Prior Publication Data

US 2019/0270637 A1    Sep. 5, 2019

(30) Foreign Application Priority Data

Mar. 1, 2018 (DE) .................. 10 2018 203 094

(51) Int. Cl.
  *B81B 7/00* (2006.01)
  *H04R 1/02* (2006.01)
  *H04R 19/00* (2006.01)
  *H04R 19/04* (2006.01)

(52) U.S. Cl.
  CPC .......... *B81B 7/0058* (2013.01); *B81B 7/0061* (2013.01); *B81B 7/0064* (2013.01); *B81B 7/0077* (2013.01); *H04R 1/021* (2013.01); *B81B 2201/0257* (2013.01); *B81B 2203/0127* (2013.01); *B81B 2207/012* (2013.01); *H04R 19/005* (2013.01); *H04R 19/04* (2013.01); *H04R 2201/003* (2013.01)

(58) Field of Classification Search
  CPC ... B81B 7/0058; B81B 7/0061; B81B 7/0064; B81B 7/0077
  See application file for complete search history.

(56) References Cited

U.S. PATENT DOCUMENTS

| | | | | |
|---|---|---|---|---|
| 9,099,569 B2 * | 8/2015 | Lee | .................. | H04R 19/04 |
| 9,162,869 B1 * | 10/2015 | Chen | .................. | B81B 7/0064 |
| 9,227,838 B2 * | 1/2016 | Hooper | .................. | B81B 7/0064 |
| 9,239,386 B2 * | 1/2016 | Elian | .................. | B81B 7/0061 |
| 9,409,765 B1 * | 8/2016 | Desai | .................. | B81B 7/0058 |
| 2004/0046245 A1 | 3/2004 | Minervini | | |

(Continued)

FOREIGN PATENT DOCUMENTS

| | | |
|---|---|---|
| DE | 102017109821 A1 | 11/2017 |
| DE | 102017112197 A1 | 12/2017 |

(Continued)

*Primary Examiner* — Nathan W Ha
(74) *Attorney, Agent, or Firm* — Slater Matsil, LLP

(57) ABSTRACT

A MEMS assembly includes a housing having an internal volume V, wherein the housing has a sound opening to the internal volume V, a MEMS component in the housing adjacent to the sound opening, and a layer element arranged at least regionally at a surface region of the housing that faces the internal volume V, wherein the layer element includes a layer material having a lower thermal conductivity and a higher heat capacity than the housing material of the housing that adjoins the layer element.

16 Claims, 2 Drawing Sheets

(56) References Cited

U.S. PATENT DOCUMENTS

| | | | |
|---|---|---|---|
| 2010/0207257 A1* | 8/2010 | Lee | B81B 7/0061 |
| | | | 257/660 |
| 2010/0269590 A1* | 10/2010 | Guenther | B81B 7/0077 |
| | | | 73/514.15 |
| 2011/0083517 A1 | 4/2011 | Muroyama et al. | |
| 2012/0126347 A1* | 5/2012 | Yang | B81B 7/0064 |
| | | | 257/416 |
| 2013/0113054 A1* | 5/2013 | Yow | H01L 23/3107 |
| | | | 257/414 |
| 2014/0017843 A1* | 1/2014 | Jung | B81C 1/00269 |
| | | | 438/51 |
| 2015/0091108 A1* | 4/2015 | Huang | B81B 7/0058 |
| | | | 257/417 |
| 2015/0117681 A1* | 4/2015 | Watson | H04R 1/04 |
| | | | 381/174 |
| 2016/0023894 A1* | 1/2016 | Xu | B81C 1/00269 |
| | | | 257/415 |
| 2016/0159641 A1* | 6/2016 | Najafi | B81B 7/0064 |
| | | | 257/467 |
| 2017/0050842 A1* | 2/2017 | Yamada | G01R 33/098 |
| 2017/0164490 A1* | 6/2017 | Chiou | B81B 7/0058 |
| 2017/0325012 A1* | 11/2017 | Dehe | G01N 29/02 |
| 2018/0123557 A1* | 5/2018 | Sung | B81B 7/0064 |
| 2018/0305200 A1* | 10/2018 | Goller | H04R 1/086 |

FOREIGN PATENT DOCUMENTS

| | | |
|---|---|---|
| DE | 112016001157 T5 | 12/2017 |
| WO | 2007053180 A1 | 5/2007 |

* cited by examiner

| Material | Thermal Conductivity | Density | Specific heat capacity | Volumetric heat capacity | Thermal diffusivity | Cut-off frequency | Damping at 217 Hz* |
|---|---|---|---|---|---|---|---|
| | [W/(m K)] | [g/cm³] | [J/(kg K)] | [J/m³K] | [m²/s] | [Hz] | [dB] |
| DA adhesive | 0.4 | 3.5 | 600 | 2.10E+06 | 1.90E-07 | 3 | -37.1 |
| Globtop/silicone | 0.8 | 1.98 | 900 | 1.78E+06 | 4.49E-07 | 7 | -29.7 |
| Polyimide | 0.19 | 1.4 | 1100 | 1.54E+06 | 1.23E-07 | 2 | -40.9 |
| Epoxy | 0.25 | 1.5 | 1000 | 1.50E+06 | 1.67E-07 | 3 | -38.3 |
| Exp. polyurethane | 0.023 | 0.024 | 1600 | 3.84E+04 | 5.99E-07 | 10 | -27.2 |
| Plexiglas | 0.19 | 1.19 | 1465 | 1.74E+06 | 1.09E-07 | 2 | -41.9 |
| Teflon | 0.35 | 2.2 | 1050 | 2.31E+06 | 1.52E-07 | 2 | -39.1 |
| Polypropylene | 0.12 | 0.91 | 1925 | 1.75E+06 | 6.85E-08 | 1 | -46.0 |
| Polyester | 0.15 | 1.4 | 1170 | 1.63E+06 | 9.19E-08 | 2 | -43.4 |
| SU8 | 0.2 | 1.2 | 1500 | 1.80E+06 | 1.11E-07 | 2 | -41.8 |
| Parylene C | 0.084 | 1.3 | 712 | 9.18E+05 | 9.15E-08 | 1 | -43.5 |
| PVC | 0.1 | 1.47 | 840 | 1.23E+06 | 8.10E-08 | 1 | -44.5 |
| Nickel silver NB17 | 120 | 8.41 | 377 | 3.17E+06 | 3.78E-05 | 602 | -0.5 |
| Copper | 385 | 8.93 | 385 | 3.44E+06 | 1.12E-04 | 1782 | -0.1 |
| Aluminum | 201 | 2.71 | 913 | 2.47E+06 | 8.12E-05 | 1293 | -0.1 |
| Gold | 314 | 19.3 | 130 | 2.51E+06 | 1.25E-04 | 1992 | -0.1 |
| Silicon | 149 | 2.33 | 700 | 1.63E+06 | 9.14E-05 | 1454 | -0.1 |
| Dry air | 0.026 | 0.001 | 1000 | 1.00E+03 | 2.60E-05 | 414 | -1.1 |
| Water | 0.607 | 0.997 | 4180 | 4.17E+06 | 1.46E-07 | 2 | -39.4 |

* ideal first-order low-pass filter behaviour

MEMS ASSEMBLY

This application claims the benefit of German Application No. 102018203094.4, filed on Mar. 1, 2018, which application is hereby incorporated herein by reference.

TECHNICAL FIELD

Exemplary embodiments relate to a MEMS assembly or a MEMS sensor and to a method for producing same. In particular, exemplary embodiments relate to a MEMS assembly in the form of a MEMS sound transducer, such as e.g. a MEMS microphone, having a multilayered housing structure. The housing structure is now constructed in order at least to reduce ingress of thermal changes into the internal volume of the MEMS assembly on account of dynamic temperature or thermal fluctuations in the environment of the MEMS assembly. In accordance with exemplary embodiments, the housing arrangement of the MEMS assembly is configured as a thermal low-pass filter arrangement.

BACKGROUND

MEMS assemblies generally comprise an electronic component arranged on a substrate, e.g. a MEMS component (MEMS=micro electromechanical system), which is surrounded by a housing. The housing is intended to protect the MEMS assembly against external environmental influences, such as e.g. dust, dirt, moisture, etc. Some housings (packages) are also provided in order to shield the MEMS assembly against external electromagnetic radiation, wherein a metallic housing is often used for this purpose.

For sensor applications, e.g. MEMS microphone applications, stable operation of the MEMS assembly vis-a-vis temperature changes is essential on account of the high sensitivity of currently available MEMS microphones. In this regard, in some cases, i.e. in particular in microphone applications, rapid temperature changes at the MEMS microphone, e.g. with a frequency of greater than 20 Hz, are of significance since these "rapid" temperature changes can generate acoustically relevant signals, i.e. disturbing signal portions in the sensor output signal. In this case, it is unimportant whether the rapid temperature changes are generated outside the sensor or MEMS assembly or in some pails of the sensor assembly housing or sensor package.

In this context, it is pointed out, for example, that in mobile devices, such as e.g. so-called smartphones, MEMS microphone assemblies are arranged within the housing of the mobile device, wherein the MEMS microphone assemblies can also be arranged relatively near to power assemblies, such as e.g. transceiver assemblies and the associated antenna structures, of the mobile device. Since the GSM mobile radio standard, for example, has a pulsed output signal having a repetition frequency of approximately 217 Hz, thermal fluctuations corresponding to the packet repetition frequency of the GSM mobile radio standard can be generated outside the MEMS microphone assembly by corresponding transmitting and/or receiving assemblies. These temperature fluctuations can be coupled into the housing of the MEMS component and influence output signals provided by the MEMS component. The resulting signal-to-noise ratio (SNR) can decrease as a result.

Since, in the field of sensors, there is a constant need for MEMS sensors, such as e.g. MEMS microphones or MEMS pressure sensors, which detect the desired measurement variables, such as e.g. acoustic signals or pressure changes, with a sufficiently high accuracy, one requirement consists in reducing the influence of temperature fluctuations on a MEMS assembly or MEMS sensor.

Such a need can be met by the subject matter of the present independent patent claims. Developments of the present concept are defined in the dependent claims.

SUMMARY

A MEMS assembly comprises a housing having an internal volume V, wherein the housing has a sound opening to the internal volume V. The MEMS assembly furthermore comprises a MEMS component in the housing adjacent to the sound opening, and a layer element arranged at least regionally at a surface region of the housing that faces the internal volume V. The layer element comprises a layer material having a lower thermal conductivity and optionally a higher heat capacity than the housing material of the housing that adjoins the layer element.

In accordance with exemplary embodiments, the dynamic heat transmission or the dynamic heat transfer through the housing into the internal volume V of the MEMS assembly can be at least reduced by the housing being modified by arrangement of a layer element. The sensitivity of the MEMS component vis-à-vis rapid temperature changes outside the MEMS assembly can be reduced as a result. In this regard, in accordance with exemplary embodiments, an additional layer or a layer element comprising a layer material is arranged at least at such sections at the surface region of the housing facing the internal volume V (i.e. at the internal surface) which are effective as dominant heat transporters or heat generators. The additional layer material is for example designed to be effective itself, or in combination with the further, e.g. metallic, material of the housing, as a thermal filter arrangement which makes it possible, on the one hand, to allow slow temperature changes in the environment of the MEMS assembly 100 to pass through the housing, but on the other hand to average out or filter out, i.e. effectively block, rapid temperature changes on average.

Consequently, a "thermal crosstalk" (also called: "coexistence interference") from further assemblies or power assemblies arranged externally with respect to the MEMS assembly 100 can be reduced extremely effectively by the specific modification of the housing as a thermal filter arrangement in particular for relatively rapid temperature changes.

BRIEF DESCRIPTION OF THE DRAWINGS

Exemplary embodiments of apparatus and/or method are described in greater detail by way of example below with reference to the accompanying figures and drawings, in which:

FIG. 2 shows an exemplary, tabular overview of some relevant materials for the layer element at the housing of the MEMS assembly in accordance with one exemplary embodiment.

DETAILED DESCRIPTION OF ILLUSTRATIVE EMBODIMENTS

Figure 1:
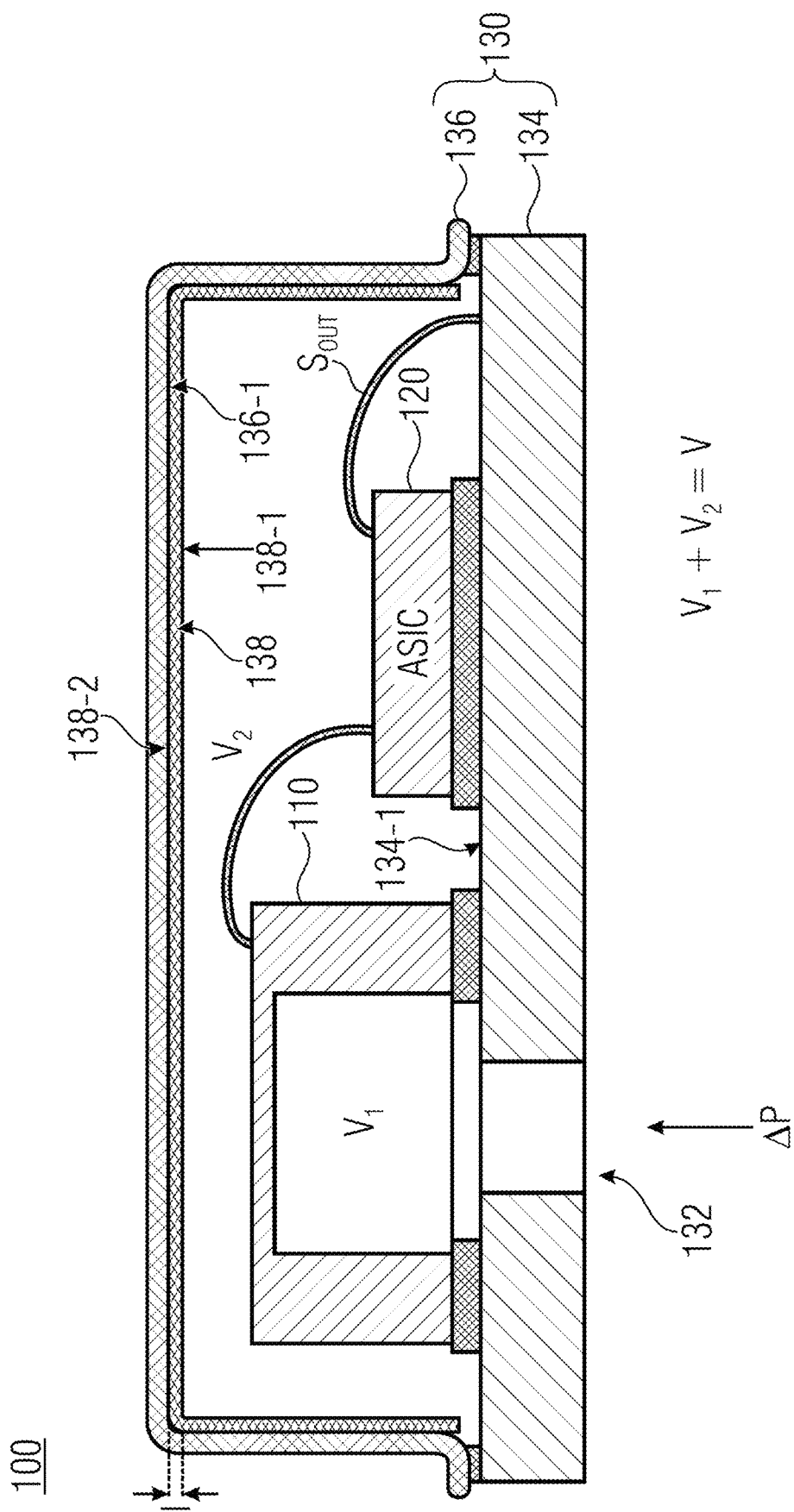
FIG. 1 shows a basic illustration in a cross-sectional view of a MEMS assembly comprising a for example membrane-based MEMS sound transducer or MEMS microphone and a circuit device (ASIC) electrically coupled thereto in accordance with one exemplary embodiment.

Before exemplary embodiments are explained more specifically in detail below with reference to the figures, it is pointed out that identical, functionally identical or identically acting elements, objects, function blocks and/or method steps in the different figures are provided with the same reference signs, and so the description of said elements, objects, function blocks and/or method steps that is presented in the different exemplary embodiments is mutually interchangeable or can be applied to one another.

Various exemplary embodiments will now be described more thoroughly with reference to the accompanying figures, in which some exemplary embodiments are illustrated. In the figures, the thicknesses of lines, layers and/or regions may be illustrated in a manner not to scale, for elucidation purposes.

Hereinafter, a MEMS assembly 100 comprising a MEMS component no and an optional circuit device 120 (ASIC=application specific integrated circuit) electrically coupled thereto will now be described with reference to FIG. 1 in the form of a basic illustration in a cross-sectional view. As is illustrated in FIG. 1, the MEMS component no can be arranged in a housing 130 having an internal volume V, wherein the housing 130 has for example an access or sound opening 132 to the internal volume V. The MEMS component no is arranged in the housing 130 for example adjacent to a sound opening 132. The housing 130 can then comprise for example a substrate 134 and a covering element 136, which can be configured as electrically conductive at least regionally, wherein a layer element 138 can be arranged at least regionally at the inner surface region 136-1 of the covering element 136. Additionally or alternatively, the layer element 138 can be arranged at least regionally at the inner surface region 134-1 of the substrate 134.

The MEMS component no can be configured for example as a MEMS sound transducer. It is pointed out, however, that the following explanations are equally applicable to any MEMS components, e.g. pressure sensors, etc., which are accommodated in a housing.

In one exemplary arrangement as a MEMS sound transducer, the MEMS component no can subdivide the internal volume V into a front volume $V_1$ and a back volume $V_2$, wherein the front volume $V_1$ is situated in the region between the sound opening 132 and the MEMS sound transducer 110, and wherein the back volume $V_2$ is situated on the opposite side thereto of the MEMS sound transducer 110 in the internal volume of the housing 130. The housing 130 then furthermore comprises a layer element 138 arranged at least regionally at a surface region 136-1 of the housing 130, facing the internal volume V, i.e. for example at the internal surface 136-1 of the covering element 136. The layer element 138 is configured for example at least regionally to reduce or to prevent a dynamic heat transfer into the internal volume V of the MEMS assembly 100. The layer element 138 has a surface region 138-1 facing the internal volume V and a surface region 138-2 facing the housing 130. The layer element 138 can also form a part of the housing 130.

The layer element 138 then comprises a layer material having a lower thermal conductivity and optionally a higher heat capacity or thermal mass than the housing material of the housing 130 that adjoins e.g. the layer element 138.

Generally, the heat capacity $C_{Therm}$ of a body is defined as the ratio of the heat $\Delta Q$ supplied to the body to the temperature change $\Delta T$ brought about thereby in accordance with the formula:

$$C_{Therm} = \frac{\Delta Q}{\Delta T}.$$

The thermal conductivity (also coefficient of thermal conduction) is a material property that determines the heat flow through a material on account of thermal conduction. How well a material conducts heat and how well suited it is to thermal insulation can be inferred from the thermal conductivity. The thermal conductivity can be specified as follows:

$$\overset{\circ}{Q} = \lambda \cdot A \cdot \frac{\Delta T}{l}$$

wherein $\overset{\circ}{Q}$ is the heat flow, A is the cross-sectional area of the layer element 138 through which the heat flow passes, l is the thickness of the layer element 138, $\lambda$ is the specific thermal conductivity of the layer element 138 and $\Delta T$ is the temperature difference between the marginal surfaces 138-1, 138-2 of the layer element 138 having the thickness l.

The above definitions or specifications for the thermal conductivity and heat capacity should merely be assumed to be an exemplary description of these physical properties of the layer element 138.

As is illustrated by way of example in FIG. 1, the layer element 138 is arranged substantially at the entire surface region 136-1 of the covering element 136 that faces the internal volume. In accordance with exemplary embodiments, the layer element 138 can also be arranged only in sections or regionally at the surface region 136-1 of the housing 136 that faces the internal volume, i.e. at one such region or a plurality of such regions which are effective as predominant heat transmitting regions or heat generating regions. By way of example, if the covering element 136 in its entirety can be assumed to be a dominant heat transmitting element, the layer element 138 can also substantially be arranged at the entire inner surface region 136-1 of the covering element 136, or cover the inner surface region of the covering element 136. Optionally, the layer element 138 can also be arranged for example at a surface region 134-1 of the substrate 134 that faces the internal volume, although this is not explicitly illustrated in FIG. 1.

The layer material of the layer element 138 can then be chosen to have a thermal conductivity that is lower than the thermal conductivity of the covering material of the conductive covering element 136 by a factor of at least 5, 10, 20 or 100, wherein the layer material of the layer element 138 can furthermore be chosen to have a heat capacity that is higher at least by a factor of 5, 10, 20 or 100 than the heat capacity of the housing material of the covering element 136 that adjoins the layer element 138.

The layer element 138 or the layer sequence comprising the layer element 138 and the covering element 136 adjoining the latter are then configured for example as a thermal filter element or a thermal low-pass filter arrangement for temperature changes, such as e.g. temperature fluctuations or thermal fluctuations, with a change cut-off frequency $f_{cut-off} \leq 200$ Hz, 100 Hz, 50 Hz or 20 Hz. The cut-off frequency $f_{cut-off}$ is thus that value of the frequency of the temperature changes which when exceeded means that the dynamic heat transfer through the housing or package 130 in the internal volume V of the MEMS assembly 100 falls below a specific value, e.g. by at least 25%, 50%, 75% or 90% relative to a comparative situation without a layer element.

The thermal low-pass filter arrangement comprising the layer element 138 or the layer sequence comprising the layer element 138 and the covering element 136 adjoining the latter is thus configured at least to reduce ingress of thermal fluctuations e.g. on account of pulsed electromagnetic interference radiation having a pulse frequency of at least 10, 20, 50, 100 or 200 Hz or higher into the internal volume V of the housing 130.

In accordance with exemplary embodiments, the covering element 136 can be configured as electrically conductive and can be electrically coupled or connected to a conductive structure (not shown in FIG. 1) at the substrate 134 in order to be able to electrically connect the covering element 136 to a reference potential, e.g. ground potential.

In accordance with exemplary embodiments, the MEMS assembly 100 furthermore optionally comprises the integrated circuit device 120 (ASIC) in the internal volume of the housing 130, e.g. on the substrate 134. The circuit device 120, which for example is electrically coupled to the MEMS sound transducer no, can then be configured to detect a counterelectrode structure (not shown in FIG. 1) on the basis of a deflection of a membrane structure (not shown in FIG. 1) of the sound transducer element no, said deflection being brought about by an acoustic sound pressure change ΔP, and to provide a corresponding audio output signal $S_{OUT}$.

The MEMS component no can thus be configured as a MEMS sound transducer or MEMS microphone having a membrane structure and an assigned counterelectrode structure (neither of which is shown in FIG. 1).

In accordance with one exemplary embodiment, the MEMS component no (the MEMS microphone) can subdivide the internal volume V into a front volume $V_1$ and a back volume $V_2$, wherein the front volume $V_1$ is situated in the region between the sound opening 132 and the MEMS component no, and wherein the back volume $V_2$ is situated on the opposite side thereto of the MEMS component no in the internal volume V of the housing 130.

The MEMS component 110, which for example is configured as a MEMS microphone, can comprise a further counterelectrode structure (not shown in FIG. 1) and thus be configured in a dual backplate configuration (in a configuration having two counterelectrode structures and the intervening membrane structure).

In accordance with a further embodiment, the MEMS component no (MEMS microphone) can comprise a further membrane structure (not shown in FIG. 1), which for example is mechanically connected to the membrane structure by means of mechanical connection elements (not shown in FIG. 1), in order to form a so-called dual membrane configuration, i.e. a configuration having two membrane structures and an intervening counterelectrode structure.

In accordance with exemplary embodiments, the layer element 138 can comprise a plastics material, such as e.g. a polyimide material or an SU-8 material, or else a glass material as layer material. In accordance with a further exemplary embodiment, the layer element 130 can also comprise a layer sequence composed of a plurality of different plastics materials or glass materials and/or plastics and glass materials. Furthermore, the covering element 136 can comprise a conductive, metallic housing material.

The layer material of the layer element 138 can be added for example before or else after the trimming of the covering element 136 as an additional layer or an additional layer element 138 at the inner surface region 136-1 of the covering element 136. For applying the layer material of the layer element 138, it is possible to employ for example inkjet techniques for applying material. The layer material of the layer element 138 applied by means of inkjet techniques, for example, can comprise a polyimide material or an SU-8 material, wherein the layer thickness of the applied layer material can be set by the number of printing processes or runs and the printing density (DPI=dots per inch) the resulting layer thickness of the layer element 138.

Typical layer thicknesses for the covering element 136 lie in a range around 100 μm, that is to say e.g. in a range of between 50 and 200 μm. Typical layer thicknesses for the layer element 138 lie in a range of between 5 and 200 μm. Typical materials for the covering element 136 and/or the layer element 138 comprise for example polyimide, epoxy, resins, etc.

FIG. 2 shows, in section "I" therein, an exemplary, tabular overview of some relevant materials for the layer element 138 at the housing of the MEMS assembly in accordance with one exemplary embodiment. Section "II" of the tabular overview presents some metallic materials that can be used for example as typical materials for the electrically conductive covering element 136. Section "III" presents a few more materials as further comparative examples. The columns of the table indicate, for example, the thermal conductivity, the density, the specific heat capacity, the volumetric heat capacity, the thermal diffusivity, the cut-off frequency and the damping at 217 Hz of the respective material.

In the case of the above parameters, the thermal diffusivity represents an important parameter, such that materials having a low value of the thermal diffusivity are well suited to insulating the covering element 136 or housing 130. As can furthermore be gathered from the table in FIG. 2, the materials in section I have a thermal diffusivity lower than that of the materials in section II by at least two orders of magnitude. The combination of a low thermal conductivity, a high density and a high specific heat capacity are important factors for reducing the thermal diffusivity as far as possible. In this regard, it can be gathered from the table in FIG. 2 that materials such as e.g. polyimide, SU8, Parylene C, polyester/PET, epoxy and generally all other non-conductive polymer materials are suitable for forming the layer material of the layer element 138.

Furthermore, further technical further developments of polymer materials, copolymer materials and composite polymer materials can be obtained which further increase the reduction of the thermal diffusivity. Polymer materials and their derivatives are a class of materials which can be used as layer material of the layer element 138, although it is pointed out that other thermal insulators, such as e.g. ceramic materials, can also be used as thermal barriers, i.e. also as the layer material of the layer element 138. Such thermal barriers can be obtained by various production processes, such as e.g. evaporation, spin/spray coating (and optionally together with photolithography), dipping, transfer printing and/or thermoforming processes, wherein this listing of production processes should not be regarded as exhaustive.

If, for example, a material density of the layer material 138 of approximately 100 μm is then assumed, the table illustrated in FIG. 2 furthermore provides a qualitative indication of the frequency pole which is introduced by the insulation material, i.e. the layer material of the layer element 138, and the normalized damping thereof at a specific frequency at 217 Hz (last column).

The layer material of the layer element 138 can for example also be applied as an adhesive layer or a film or plastics film on the surface region 134-1, 136-1 of the housing 130 that faces the internal volume V. The layer material of the layer element 138 can be applied for example by means of application methods such as e.g. embossing (or hot embossing), sputtering, vapor deposition, etc., at least regionally at the surface region 134-1, 136-1 of the housing 130 and of the conductive covering element 136, respectively, that faces the internal volume V.

In accordance with a further exemplary embodiment, the layer material of the layer element 138 can be performed or formed from a material having a low thermal conductivity and optionally a high heat capacity, wherein a metallization layer 136 can subsequently be applied at an outer side 138-2, i.e. that side of the layer element 138 which faces away from the internal volume V of the housing 130, in order to form the covering element 136 formed in an electrically conductive fashion.

On the basis of the present concept, in accordance with predefined requirements, e.g. on the part of customers, simplification can be effected since, for example, in the case of mobile devices currently used, such as e.g. smartphones, notebooks, tablets, laptops, smart watches, etc., which are configured with the present MEMS assembly e.g. as a MEMS sensor (MEMS pressure sensor, MEMS sound transducer or MEMS microphone), disturbing coexistence signals at the system level can be minimized by using the present thermal shielding concept for the housing 130 of the MEMS assembly 100.

In accordance with exemplary embodiments, the dynamic heat transmission through the housing into the internal volume V of the MEMS assembly 100 can thus be at least reduced by the housing 130 being modified by arrangement of a layer element 138 comprising a material having a lower thermal conductivity and optionally a high heat capacity (e.g. in relation to the covering element 136). As a result, it is possible to reduce the sensitivity of the MEMS component no vis-à-vis rapid temperature changes outside the MEMS assembly. The additional layer of the layer element 138 is arranged at least at such sections at the inner surface 136-1 of the housing 130 which are effective as dominant heat transporters or heat generators. The additional layer material 138 is for example designed to be effective as a thermal filter element that makes it possible on the one hand to allow slow temperature changes in the environment of the MEMS assembly 100 to pass through the housing 130, but on the other hand to effectively block rapid temperature changes outside the internal volume V.

Consequently, a "thermal crosstalk" from further assemblies or power assemblies (not shown in FIG. 1) arranged adjacently with respect to the MEMS assembly 100 can be reduced extremely effectively by the specific modification of the housing 130 as a thermal filter arrangement in particular for relatively rapid temperature changes.

While exemplary embodiments are suitable for various modifications and alternative forms, accordingly exemplary embodiments of same are shown by way of example in the figures and described thoroughly here. It goes without saying, however, that the intention is not to limit exemplary embodiments to the specific forms disclosed, rather on the contrary the exemplary embodiments are intended to cover all modifications, counterparts and alternatives that fall within the scope of the disclosure. Throughout the description of the figures, identical reference signs refer to identical or similar elements.

It goes without saying that if one element is designated as "connected" or "coupled" to another element, it can be connected or coupled directly to the other element or intermediate elements can be present. If, in contrast, one element is designated as "connected" or "coupled" "directly" to another element, no intermediate elements are present. Other expressions used for describing the relationship between elements should be interpreted in a similar way (e.g. "between" vis-à-vis "directly between", "adjacent" vis-à-vis "directly adjacent", etc.). Furthermore, the formulation "at least one" element should be understood to mean that one element or a plurality of elements can be provided.

Although some aspects have been described in association with a MEMS assembly, it goes without saying that some aspects also constitute a description of the corresponding production method with corresponding method steps for producing a MEMS assembly. In this regard, providing a block or a component should also be understood as a method step or a feature of a method step of a corresponding method. Some or all of the method steps can be carried out by a hardware apparatus (or using a hardware apparatus), such as using a microprocessor, a programmable computer or an electronic circuit. In some exemplary embodiments, some or a plurality of the most important method steps can be carried out by such an apparatus.

In the detailed description above, in some instances different features have been grouped together in examples in order to rationalize the disclosure. This type of disclosure ought not be interpreted as the intention that the claimed examples have more features than are expressly indicated in each claim. Rather, as represented by the following claims, the subject matter can reside in fewer than all features of an individual example disclosed. Consequently, the claims that follow are hereby incorporated in the detailed description, wherein each claim can be representative of a dedicated separate example. While each claim can be representative of a dedicated separate example, it should be noted that although dependent claims refer back in the claims to a specific combination with one or more other claims, other examples also comprise a combination of dependent claims with the subject matter of any other dependent claim or a combination of each feature with other dependent or independent claims. Such combinations shall be encompassed, unless an explanation is given that a specific combination is not intended. Furthermore, the intention is for a combination of features of a claim with any other independent claim also to be encompassed, even if this claim is not directly dependent on the independent claim.

Although specific exemplary embodiments have been illustrated and described herein, it will be apparent to a person skilled in the art that a multiplicity of alternative and/or equivalent implementations can be substituted for the specific exemplary embodiments shown and illustrated there, without departing from the subject matter of the present application. This application text is intended to cover all adaptations and variations of the specific exemplary embodiments described and discussed herein. Therefore, the present subject matter of the application is limited only by the wording of the claims and the equivalent embodiments thereof.

What is claimed is:

1. A MEMS assembly comprising:
 a housing having an internal volume,
 a MEMS component in the housing, and
 a layer element arranged at least regionally at a surface region of the housing that faces the internal volume,
 wherein the layer element comprises a layer material having a lower thermal conductivity than a housing material of the housing that adjoins the layer element,
 wherein the housing comprises a substrate and a covering element configured to be electrically conductive at least regionally, and wherein at least a portion of the covering element directly faces the internal volume.

2. The MEMS assembly as claimed in claim 1, wherein the layer element comprises a layer material having a higher heat capacity than the housing material of the housing that adjoins the layer element.

3. The MEMS assembly as claimed in claim 1, wherein the layer element is arranged at least regionally at the covering element.

4. The MEMS assembly as claimed in claim 1, wherein the thermal conductivity of the layer material of the layer element is lower by a factor of at least five than the thermal conductivity of the housing material of the housing that adjoins the layer element.

5. The MEMS assembly as claimed in claim 2, wherein the heat capacity of the layer material of the layer element is higher at least by a factor of five than the heat capacity of the housing material of the housing that adjoins the layer element.

6. The MEMS assembly as claimed in claim 5, wherein the layer element or a layer sequence comprising the layer element and the housing material of the housing that adjoins said layer element is configured as a thermal low-pass filter arrangement for temperature changes with a change cut-off frequency $f_{cut-off} \leq 20$ Hz.

7. The MEMS assembly as claimed in claim 6, wherein the thermal low-pass filter arrangement at least reduces introduction of thermal fluctuations on account of pulsed electromagnetic interference radiation having a pulse frequency of 20 Hz or higher into the internal volume of the housing.

8. The MEMS assembly as claimed in claim 1, wherein the covering element is configured as electrically conductive and is electrically connected to a conductive structure at the substrate.

9. The MEMS assembly as claimed in claim 1, wherein the MEMS component furthermore comprises a circuit device in the internal volume of the housing.

10. The MEMS assembly as claimed in claim 9, wherein the MEMS component is configured as a MEMS sound transducer or a MEMS microphone comprising a membrane structure and an assigned counterelectrode structure.

11. The MEMS assembly as claimed in claim 10, wherein the circuit device is electrically coupled to the MEMS component, wherein the circuit device is furthermore configured to detected an output signal of the MEMS component on the basis of a deflection of the membrane structure relative to the counterelectrode structure, said deflection being brought about by an acoustic sound pressure change.

12. The MEMS assembly as claimed in claim 1, wherein the layer element comprises a plastics material or a glass material as layer material.

13. The MEMS assembly as claimed in claim 12, wherein the layer element comprises a multilayered layer material having a plurality of plastics material layers and/or glass material layers.

14. The MEMS assembly as claimed in claim 12, wherein the plastics material comprises a polyimide material and/or an SU-8 material.

15. The MEMS assembly as claimed in claim 1, wherein the covering element comprises a conductive, metallic housing material.

16. The MEMS assembly as claimed in claim 1, wherein the housing comprises an opening to the internal volume, and wherein the MEMS component is configured in the housing adjacent to the opening.

* * * * *